(12) United States Patent
Liu et al.

(10) Patent No.: US 10,636,755 B2
(45) Date of Patent: Apr. 28, 2020

(54) ELECTRONIC PRODUCT

(71) Applicant: HANNSTAR DISPLAY CORPORATION, Taipei (TW)

(72) Inventors: Hsuan-Chen Liu, Kaohsiung (TW); Yu-Tuan Hsu, Taichung (TW)

(73) Assignee: HANNSTAR DISPLAY CORPORATION, Taipei (TW)

( * ) Notice: Subject to any disclaimer, the term of this patent is extended or adjusted under 35 U.S.C. 154(b) by 0 days.

(21) Appl. No.: 16/207,197

(22) Filed: Dec. 3, 2018

(65) Prior Publication Data

US 2019/0206818 A1 Jul. 4, 2019

(30) Foreign Application Priority Data

Dec. 28, 2017 (CN) .......................... 2017 1 1456462

(51) Int. Cl.
*H01L 23/00* (2006.01)
*H01L 27/12* (2006.01)
*H01L 27/32* (2006.01)

(52) U.S. Cl.
CPC ............ *H01L 24/05* (2013.01); *H01L 23/564* (2013.01); *H01L 24/03* (2013.01); *H01L 24/06* (2013.01); *H01L 24/08* (2013.01); *H01L 27/1218* (2013.01); *H01L 27/1248* (2013.01); *H01L 27/3276* (2013.01); *H01L 27/124* (2013.01); *H01L 27/1259* (2013.01); *H01L 2224/0362* (2013.01); *H01L 2224/05024* (2013.01); *H01L 2224/05076* (2013.01); *H01L 2224/05083* (2013.01); *H01L 2224/05084* (2013.01); *H01L 2224/06135* (2013.01); *H01L 2224/08225* (2013.01); *H01L 2924/20641* (2013.01)

(58) Field of Classification Search
CPC ....... H01L 23/00; H01L 23/564; H01L 24/03; H01L 24/05; H01L 24/06; H01L 24/08; H01L 27/124; H01L 27/1218; H01L 27/1248; H01L 27/1259; H01L 27/3276; H01L 2224/0362; H01L 2224/05024; H01L 2224/05076; H01L 2224/05083; H01L 2224/05084; H01L 2224/06135; H01L 2224/08225
USPC .......................................................... 257/782
See application file for complete search history.

(56) References Cited

U.S. PATENT DOCUMENTS

2004/0109101 A1* 6/2004 Kim .................. G02F 1/136209
349/44
2017/0033009 A1* 2/2017 Scanlan .................. H01L 24/20

* cited by examiner

*Primary Examiner* — Chuong A Luu
(74) *Attorney, Agent, or Firm* — Winston Hsu

(57) ABSTRACT

An electronic product includes a substrate and a bonding pad structure. The bonding pad structure is disposed on the substrate, and the bonding pad structure includes a first metal layer, a first insulating layer, at least one first connecting hole and a transparent conductive layer. The first metal layer and the first insulating layer are disposed on the substrate. The first connecting hole is situated in the first insulating layer, and the first connecting hole exposes a portion of the first metal layer. The transparent conductive layer is disposed on the first insulating layer, and the transparent conductive layer has a first edge and a second edge opposite to the first edge, wherein the transparent conductive layer is electrically connected to the first metal layer through the first connecting hole. A spacing between the first edge and the first connecting hole is greater than or equal to 100 μm.

17 Claims, 7 Drawing Sheets

ELECTRONIC PRODUCT

CROSS REFERENCE TO RELATED APPLICATION

This application claims the priority benefit of China Patent Application Serial No. 201711456462.4, filed Dec. 28, 2017. The entirety of the above-mentioned patent application is hereby incorporated herein by reference and made a part of this specification.

BACKGROUND OF THE INVENTION

1. Field of the Invention

The present invention relates to an electronic product, and more particularly to an electronic product having a bonding pad structure for reducing damage of water vapor.

2. Description of the Prior Art

Nowadays, electronic product has become an indispensable item in society. In the general electronic product, a bonding pad is disposed on a substrate, such that electronic structures (such as electronic devices, electronic modules and electronic components) can be electrically connected to each other through the bonding pad, and signals can be transmitted. For instance, the electronic product may be a display panel (or a touch display panel), and the bonding pad can be disposed on the substrate of the display panel and for being electrically connected to a flexible printed circuit (FPC). However, when the water vapor invade the conventional electronic product, the bonding pad of the electronic product is damaged by the water vapor easily, such that the conductive path is damaged to cause the breakdown of the electronic product and decrease the life time of the electronic product. Therefore, to retard or prevent the bonding pad from damage by the water vapor needs to be achieved.

SUMMARY OF THE INVENTION

The present invention provides an electronic product having a bonding pad structure, and a specific spacing exists between a connecting hole and an edge of the bonding pad structure, such that a water vapor damage of the bonding pad structure is mitigated, thereby enhancing the life time and reliability of the electronic product.

In order to solve the above problems, the present invention provides an electronic product including a substrate and a bonding pad structure. The bonding pad structure is disposed on the substrate, and the bonding pad structure includes a first metal layer, a first insulating layer, at least one first connecting hole and a transparent conductive layer. The first metal layer is disposed on the substrate. The first insulating layer is disposed on the first metal layer. The first connecting hole is situated in the first insulating layer, and the first connecting hole exposes a portion of the first metal layer. The transparent conductive layer is disposed on the first insulating layer, and the transparent conductive layer has a first edge and a second edge opposite to the first edge, wherein the transparent conductive layer is electrically connected to the first metal layer through the first connecting hole. Furthermore, a spacing between the first edge and the first connecting hole is greater than or equal to 100 μm.

In the electronic product of the present invention, the connecting hole of the bonding pad structure is separated from the edge of the bonding pad structure by a specific distance; that is to say, the spacing between the connecting hole and the edge of the bonding pad structure is greater than or equal to 100 μm. Therefore, the path length that the water vapor invades the connecting hole is increased. As the result, the time that the water vapor reaches the metal pattern through the connecting hole is significantly enhanced, so as to retard the phenomenon of eroding the metal pattern, protect the bonding pad structure and enhance the life time and reliability of the electronic product.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
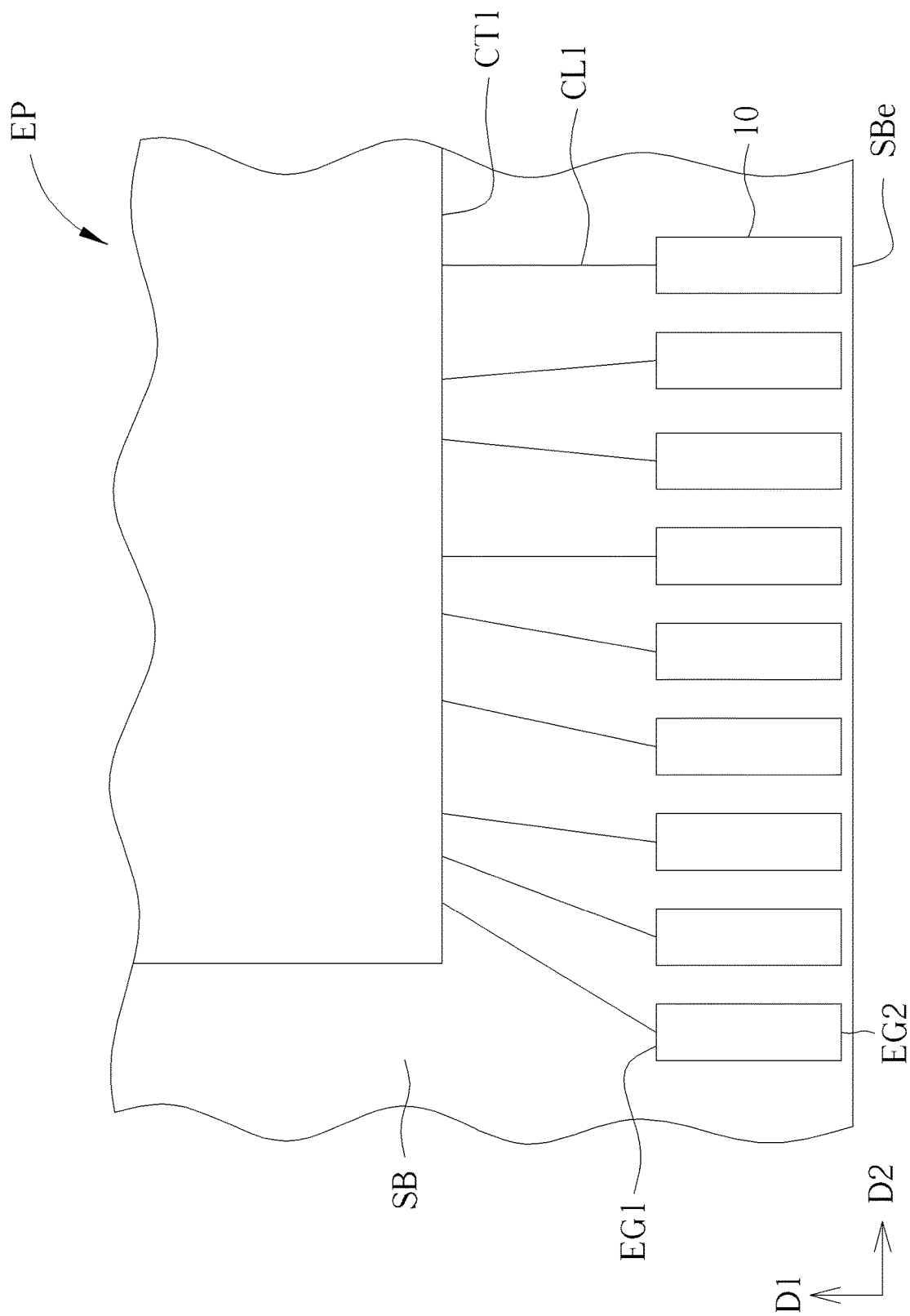
FIG. 1 and FIG. 2 are top-view schematic diagrams illustrating a portion of an electronic product of a first embodiment of the present invention.

To provide a better understanding of the present invention to those skilled in the art, preferred embodiments will be detailed in the follow description. The preferred embodiments of the present invention are illustrated in the accompanying drawings with numbered elements to elaborate on the contents and effects to be achieved. It should be noted that the drawings are simplified schematics, and therefore show only the components and combinations associated with the present invention, so as to provide a clearer description for the basic structure or implementing method of the present invention. The components would be more complex in reality. In addition, for ease of explanation, the components shown in the drawings may not represent their actual number, shape, and dimensions; details may be adjusted according to design requirements.

Figure 2:
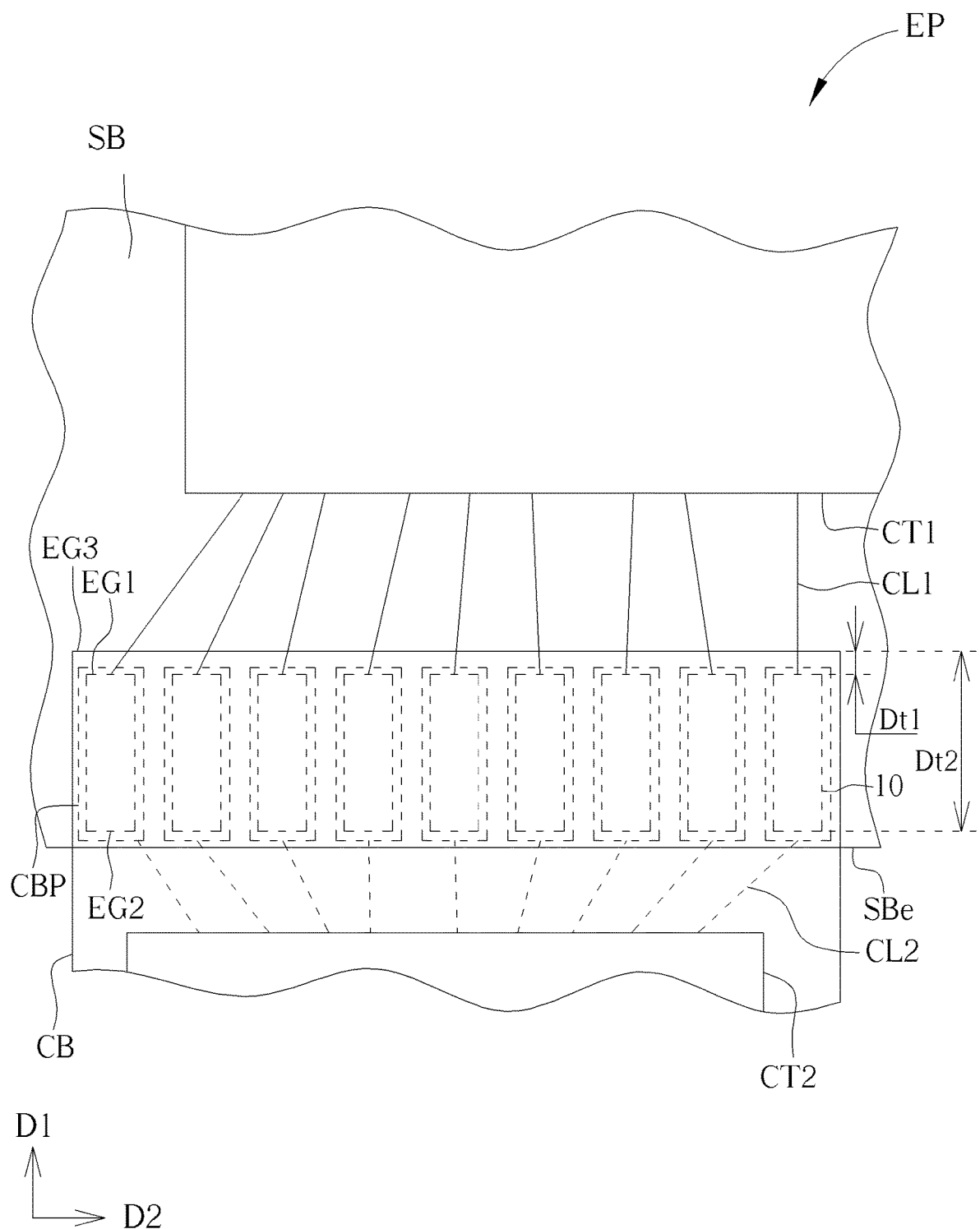
Figure 3:
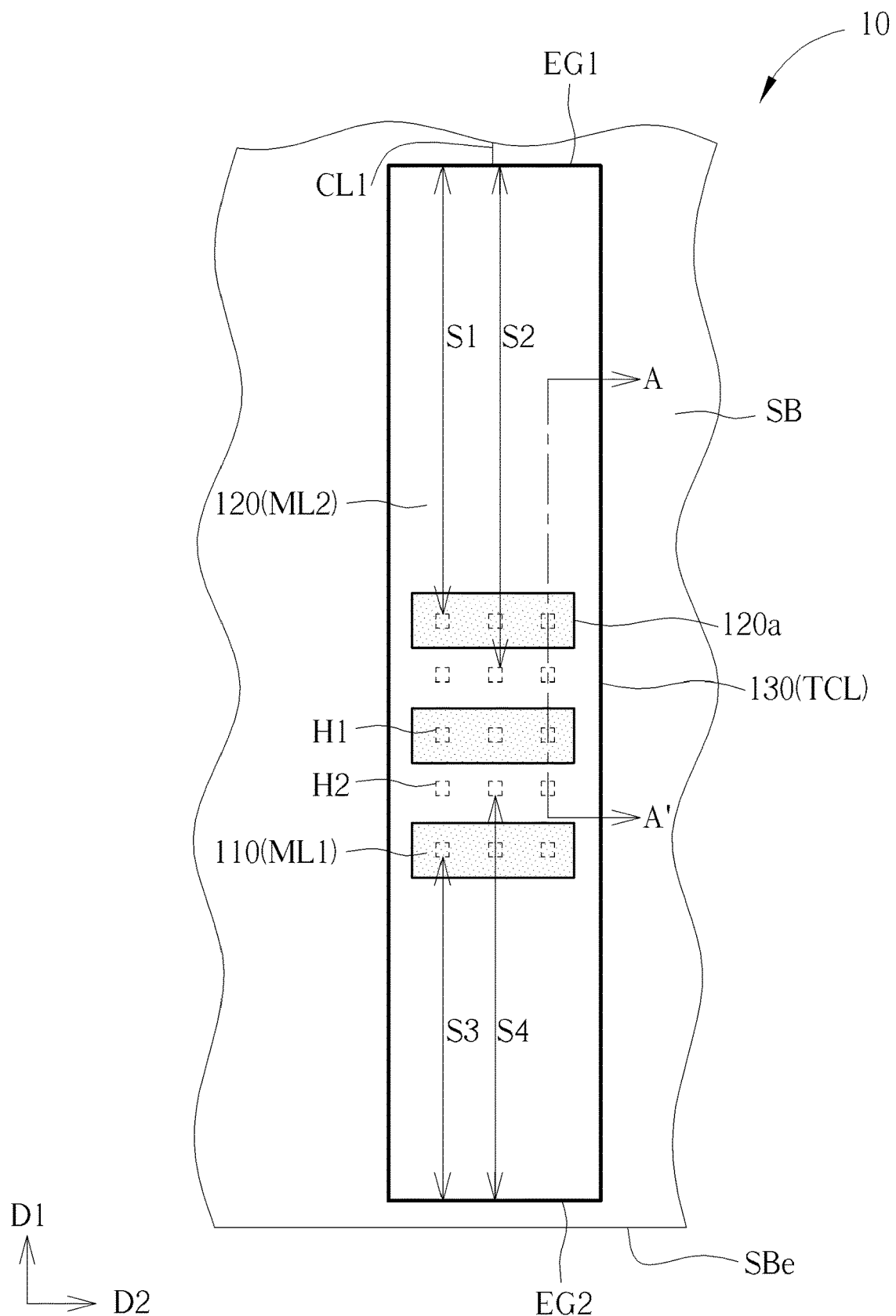
FIG. 3 is a top-view schematic diagram illustrating a bonding pad structure of the electronic product of the first embodiment of the present invention.
Figure 4:
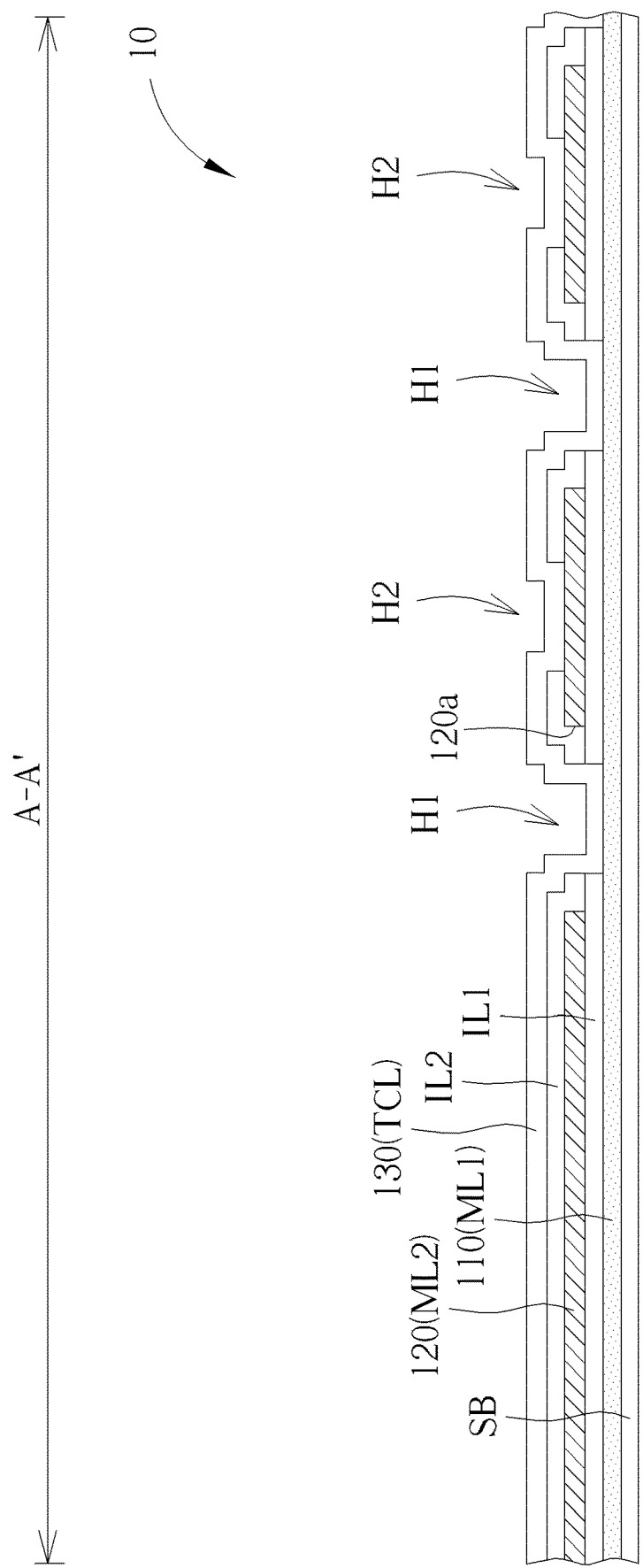
FIG. 4 is a cross-sectional view schematic diagram taken along cross-sectional line A-A' in FIG. 3.

Referring to FIG. 1 to FIG. 4, FIG. 1 and FIG. 2 are top-view schematic diagrams illustrating a portion of an electronic product of a first embodiment of the present invention, FIG. 3 is a top-view schematic diagram illustrating a bonding pad structure of the electronic product of the first embodiment of the present invention, and FIG. 4 is a cross-sectional view schematic diagram taken along cross-sectional line A-A' in FIG. 3, wherein FIG. 1, FIG. 3 and FIG. 4 do not show a circuit board (printed circuit board, PCB) CB, and FIG. 2 shows the connection between the substrate SB and the circuit board CB. As shown in FIG. 1 to FIG. 4, the electronic product EP of this embodiment includes a substrate SB and a bonding pad structure 10, and the bonding pad structure 10 is disposed on the substrate SB. The components and structures will be explained in the following. Note that the electronic product EP of the present invention may be for example a display panel, a touch panel, a touch display panel or other electronic products having the bonding pad structure 10, and the electronic product EP in this description takes the display panel as an example. In this embodiment, the substrate SB may be a rigid substrate, such as a glass substrate, a plastic substrate, a quartz substrate, a sapphire substrate, or a flexible substrate, such as a substrate including polyimide (PI) or polyethylene terephthalate (PET), but the invention is not limited thereto.

A plurality of conductive layers (such as metal layer or transparent conductive layer) and at least one insulating layer may be disposed on the substrate SB of this embodiment to form electronic components, e.g. active components (such as thin film transistor), passive components (such as resistor or capacitor), traces, bonding pads, display components (such as pixel electrode or common electrode) or other suitable electronic components. The conductive layer may include metal material (having great conductivity or low resistance) and/or transparent conductive material (such as indium tin oxide (ITO) or indium zinc oxide (IZO)), and the material of the insulating layer may include organic material and/or inorganic material, such as silicon dioxide, silicon nitride or silicon oxynitride, but the invention is not limited thereto. In detail, in this embodiment, a first metal layer ML1, a first insulating layer IL1 and a transparent conductive layer TCL may be disposed on the substrate SB, wherein the first metal layer ML1 is disposed on the substrate SB, the first insulating layer IL1 is disposed on the first metal layer ML1, and the transparent conductive layer TCL is disposed on the first insulating layer IL1, but the arrangement of the layers is not limited thereto. Other conductive layers, other insulating layer and/or other suitable layers may be further disposed on the substrate SB; for example, a second metal layer ML2 may be disposed on the first insulating layer IL1, wherein the first metal layer ML1 and the second metal layer ML2 are separated by the first insulating layer IL1 and are not in direct contact with each other, and a second insulating layer IL2 may be disposed between the second metal layer ML2 and the transparent conductive layer TCL, but the invention is not limited thereto. Note that the insulating layers (the first insulating layer IL1 and the second insulating layer IL2) have a function of separating the conductive layers and a function of resisting water vapor. In this embodiment, the bonding pad structure 10 disposed on the substrate SB includes a first metal pattern 110 formed of the first metal layer ML1, a portion of the first insulating layer IL1, a transparent conductive pattern 130 formed of the transparent conductive layer TCL, and at least one first connecting hole H1 configured to make the first metal pattern 110 and the transparent conductive pattern 130 be electrically connected to each other. Moreover, the bonding pad structure 10 may optionally further include a second metal pattern 120 formed of the second metal layer ML2, a portion of the second insulating layer IL2, and at least one second connecting hole H2 configured to make the second metal pattern 120 and the transparent conductive pattern 130 be electrically connected to each other. The first connecting hole H1 is situated in the first insulating layer IL1 and the second insulating layer IL2, such that the first connecting hole H1 exposes a portion of the first metal pattern 110. The second connecting hole H2 is situated in the second insulating layer IL2, such that the second connecting hole H2 exposes a portion the second metal pattern 120. The transparent conductive pattern 130 is in contact with the first metal pattern 110 and the second metal pattern 120 respectively through the first connecting hole H1 and the second connecting hole H2, such that the transparent conductive pattern 130 is electrically connected between the first metal pattern 110 and the second metal pattern 120. That is to say, the first metal pattern 110 is electrically connected to the second metal pattern 120 through the transparent conductive pattern 130. Thus, the bonding pad structure 10 is formed by the first metal layer ML1, the first insulating layer IL1, the second metal layer ML2, the second insulating layer IL2 and the transparent conductive layer TCL, but the invention is not limited thereto. In another embodiment, the bonding pad structure 10 may be formed by the first metal layer ML1, the first insulating layer IL1 and the transparent conductive layer TCL, or may be formed by the first metal layer ML1, the first insulating layer IL1, the second metal layer ML2, the second insulating layer IL2, the transparent conductive layer TCL, another conductive layer and another insulating layer. When the bonding pad structure 10 has more other conductive layers, such as a third metal layer and a fourth metal layer, the bonding pad structure 10 may further include other connecting holes corresponding to these conductive layers, e.g. a third connecting hole and a fourth connecting hole. Note that the term "expose" described herein means that the structure is not covered by the specific insulating layer; that is to say, the first connecting hole H1 makes a portion of the first metal pattern 110 be not covered by the first insulating layer IL1 and the second insulating layer IL2, and the second connecting hole H2 makes a portion of the second metal pattern 120 be not covered by the second insulating layer IL2. In this embodiment, the second metal pattern 120 may have at least one opening 120a making a portion of the first metal pattern 110 not overlap the second metal pattern 120 in a vertical projection direction, and the first connecting hole H1 may be situated within the opening 120a and expose a portion of the first metal pattern 110, but the invention is not limited thereto. In addition, for example, as shown in FIG. 3 and FIG. 4, the bonding pad structure 10 of this embodiment may include a plurality of the first connecting holes H1 and a plurality of the second connecting holes H2, the first connecting holes H1 and the second connecting holes H2 are arranged alternately in a direction (for example, a first direction D1), but the invention is not limited thereto. The numbers and arrangements of the first connecting holes H1 and the second connecting holes H2 may be designed based on requirements.

Moreover, for example, the electronic product EP of this embodiment may include a plurality of the bonding pad structures 10, and the bonding pad structures 10 are arranged along an edge SBe of the substrate SB. In this embodiment, the edge SBe extends along the second direction D2, and the bonding pad structure 10 are arranged along the second direction D2 and disposed adjacent to the edge SBe of the substrate SB, but the invention is not limited thereto. Note that a size of the bonding pad structure 10 may be equal to a size of the transparent conductive pattern 130 of the transparent conductive layer TCL; that is to say, edges of the transparent conductive pattern 130 may be aligned with edges of the bonding pad structure 10 respectively in the vertical projection direction. In the present invention, as shown in FIG. 1 to FIG. 3, the transparent conductive pattern 130 of the bonding pad structure 10 may have a first edge EG1 and a second edge EG2 opposite to each other in the first direction D1 (that is, two opposite edges of the bonding pad structure 10 in the first direction D1). In this embodiment, a spacing S1 between the first edge EG1 and the first connecting hole H1 is greater than or equal to 100 µm, a spacing S2 between the first edge EG1 and the second connecting hole H2 is greater than or equal to 100 µm, a spacing S3 between the second edge EG2 and the first connecting hole H1 is greater than or equal to 100 µm, and a spacing S4 between the second edge EG2 and the second connecting hole H2 is greater than or equal to 100 µm. Therefore, the spacing between one of the connecting holes and the first edge EG1 and the spacing between one of the connecting holes and the second edge EG2 are greater than or equal to 100 µm. In this embodiment, the second edge EG2 may be an edge of the transparent conductive pattern 130 closest to the edge SBe of the substrate SB, and the first edge EG1 is farther from the edge SBe of the substrate SB compared with the second edge EG2, but the invention is not limited thereto. In addition, the first direction D1 is not parallel to the second direction D2, and the first direction D1 and the second direction D2 of this embodiment is perpendicular to each other for example.

Furthermore, the electronic product EP of this embodiment may further include a first circuit CT1 and a plurality of traces CL1 disposed on the substrate SB. The traces CL1 are adjacent to the first edge EG1 of the transparent conductive pattern 130 (for example, the traces CL1 is disposed at a upper side of the bonding pad structure 10 shown in FIG. 1), and the traces CL1 are electrically connected between the first circuit CT1 and the bonding pad structure 10; that is to say, the first circuit CT1 is electrically connected to one of the bonding pad structures 10 through one of the traces CL1. At least a portion of the first circuit CT1 and/or at least a portion of the traces CL1 may be formed of at least one of the first metal layer ML1, the second metal layer ML2, the transparent conductive layer TCL and other conductive layers. For instance, the traces CL1 may be formed of the second metal layer ML2, but the invention is not limited thereto. In this embodiment, the first circuit CT1 may include one or more of active components, passive components, display components, integrated circuit (IC) and other suitable electronic components, so that the first circuit CT1 may form a circuit of the display panel relative to frame displaying (such as gate driver circuit) or other specific function, but the invention is not limited thereto. Note that, FIG. 1 and FIG. 2 show the position of the first circuit CT1, but do not show the actual components of the first circuit CT1.

In a manufacturing process of the electronic product EP of this embodiment regarded as the display panel, the substrate SB may be provided first. Next, the first metal layer ML1, the first insulating layer IL1, the second metal layer ML2, the second insulating layer IL2 and the transparent conductive layer TCL may be formed on the substrate SB in sequence. In this process, the bonding pad structure 10 and the inner structure of the display panel (e.g. a circuit structure with the thin film transistor in the array substrate) may be manufactured simultaneously. Specifically, the substrate SB is covered by the first metal layer ML1, and then, a photolithography process may be performed for patterning the first metal layer ML1, so as to form the first metal pattern 110 of the bonding pad structure 10 and a part of the inner structure of the display panel (such as a scan line, a gate, etc.). Next, the first insulating layer IL1 is formed on the first metal layer ML1, and the first insulating layer IL1 may be a gate insulator of the display panel. The second metal layer ML2 is formed on the first insulating layer IL1, and then, a photolithography process may be performed for patterning the second metal layer ML2, so as to form the second metal pattern 120 of the bonding pad structure 10 and a part of the inner structure of the display panel (such as a data line, a source, a drain, etc.). Thereafter, the second insulating layer IL2 is formed and covers the second metal layer ML2, and then, a photolithography process may be performed for forming the first connecting hole H1 and the second connecting hole H2, so as to respectively expose a portion of the first metal pattern 110 and a portion of the second metal pattern 120 of the bonding pad structure 10. The patterned transparent conductive layer TCL is formed and covers the second insulating layer IL2, so as to form the transparent conductive pattern 130 of the bonding pad structure 10 and a part of the inner structure of the display panel (such as a pixel electrode, etc.). Note that because no photolithography process is performed for patterning the first insulating layer IL1 serving as the gate insulator before forming the second metal layer ML2 in the conventional manufacturing process of the display panel, if a conventional connecting hole needs to be formed in the first insulating layer IL1 for electrically connecting the first metal pattern 110 to the second metal pattern 120 (the conventional connecting hole is formed between the first metal pattern 110 and the second metal pattern 120), the forming process of the conventional connecting hole cannot adopt the manufacturing process of the thin film transistor, and an additional photolithography process needs to be performed. In the above manufacturing process of this embodiment, since the first connecting hole H1 and the second connecting hole H2 are formed by one photolithography process at the same time, and the first metal pattern 110 and the second metal pattern 120 are electrically connected to each other through the transparent conductive pattern 130, the number of the photolithography processes may be reduced to save the cost as compared with forming the conventional connecting hole in the first insulating layer IL1 before forming the second metal layer ML2.

Figure 5:
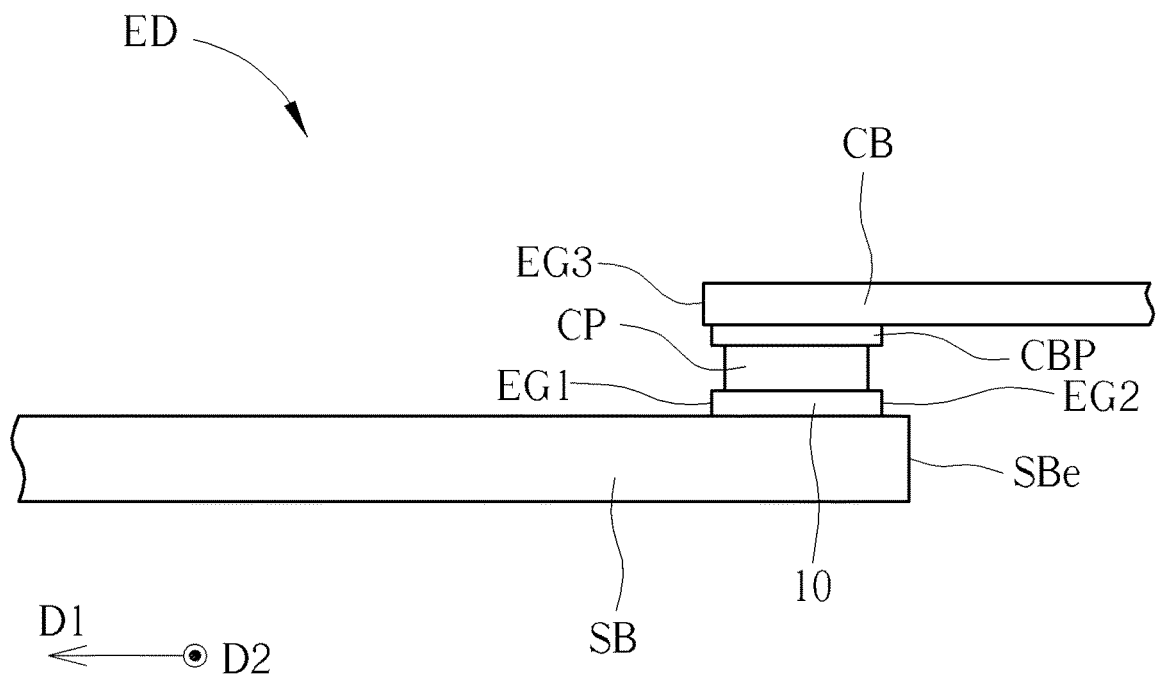
FIG. 5 is a cross-sectional view schematic diagram of a portion of an electronic product of an embodiment of the present invention.
Figure 6:
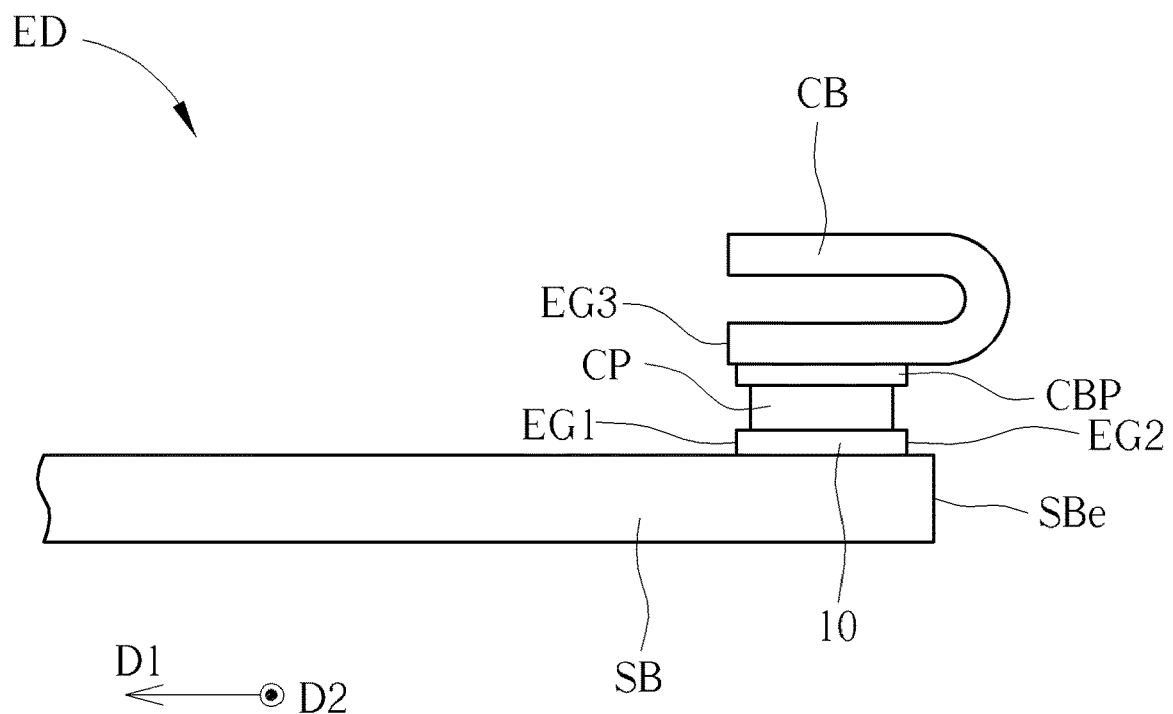
FIG. 6 is a cross-sectional view schematic diagram of a portion of an electronic product of another embodiment of the present invention.

Referring to FIG. 5, FIG. 6 and FIG. 2, FIG. 5 is a cross-sectional view schematic diagram of a portion of an electronic product of an embodiment of the present invention, and FIG. 6 is a cross-sectional view schematic diagram of a portion of an electronic product of another embodiment of the present invention, wherein FIG. 5 and FIG. 6 show the connection and arrangement between the substrate SB and the circuit board CB. As shown in FIG. 2 and FIG. 5, the electronic product EP of this embodiment may include a circuit board CB disposed on the bonding pad structure 10 of the substrate SB. The circuit board CB may include a second circuit CT2 and at least one circuit board bonding pad CBP, and the circuit board CB has a third edge EG3. The second circuit CT2 is electrically connected to the circuit board bonding pads CBP respectively through traces CL2, the circuit board bonding pads CBP are disposed adjacent to the third edge EG3 of the circuit board CB and arranged along the second direction D2, and the second circuit CT2 may include one or more of active components, passive components, integrated circuit and other suitable electronic components. In this embodiment, the circuit board CB may be a flexible printed circuit (FPC), but the invention is not limited thereto. On the other hand, in this embodiment, a number of the circuit board bonding pads CBP may be the same as the number of the bonding pad structures 10 of the substrate SB, and each of the circuit board bonding pads CBP is bonded with and electrically connected to one of the bonding pad structures 10 through a conductive adhesive CP (such as an anisotropic conductive film (ACF)), so as to form bonding structures (as shown in FIG. 5 and FIG. 6). Therefore, the first circuit CT1 of the substrate SB may be electrically connected to the second circuit CT2 of the circuit board CB, as shown in FIG. 2 and FIG. 5. The substrate SB and the circuit board CB of this embodiment may be disposed opposite to each other (or be disposed in parallel). In another embodiment, as shown in FIG. 2 and FIG. 6, the circuit board CB is disposed on the substrate SB with a U-shape or a folding type, but the present invention is not limited thereto. In particular, in FIG. 2, FIG. 5 and FIG. 6, the third edge EG3 of the circuit board CB close to the circuit board bonding pad CBP may overlap the substrate SB. In other words, in the first direction D1, a first distance Dt1 is spaced between the first edge EG1 of the transparent conductive pattern 130 of the bonding pad structure 10 and the third edge EG3, a second distance Dt2 is spaced between the second edge EG2 of the transparent conductive layer TCL and the third edge EG3, and the first distance Dt1 is less than the second distance Dt2. Note that FIG. 2 shows the position of the second circuit CT2, but does not show the actual components of the second circuit CT2. Moreover, in order to reinforce the bonding between the bonding pad structure 10 of the substrate SB and the circuit board bonding pad CBP and to meet the pull test, a length of the bonding pad structure 10 and a length of the circuit board bonding pad CBP may be greater than or equal to 450 μm, so as to obtain a suitable bonding area between the bonding pad structure 10 and the circuit board bonding pad CBP.

Generally, because the position of the bonding pad on the substrate SB is close to the edge of the circuit board CB (i.e. the third edge EG3) or the edge SBe of the substrate SB, when the bonding pad on the substrate SB is bonded with the circuit board bonding pad CBP of the circuit board CB by the conductive adhesive CP to form the bonding structure, the bonding structure is close to outside such that the water vapor can invade the bonding structure easily. For instance, when the substrate SB and the circuit board CB are disposed opposite to each other, and the circuit board CB is not bended or folded (similar to the electronic product EP shown in FIG. 5), the water vapor can invade the bonding structure from a side close to the third edge EG3 of the circuit board CB easily. For another instance, when the circuit board CB is disposed on the substrate SB with a U-shape or a folding type (similar to the electronic product EP shown in FIG. 6), the water vapor can invade the bonding structure from a side close to the third edge EG3 of the circuit board CB and from a side close to the edge SBe of the substrate SB. Although the metal layer of the bonding pad on the substrate SB is close to the edge of the substrate SB or close to the edge of the circuit board CB, because the insulating layers (the first insulating layer IL1 and the second insulating layer IL2) have the function of resisting the water vapor, if the metal layer is covered by the insulating layer (the first insulating layer IL1 or the second insulating layer IL2), the metal layer can be protected by the insulating layer from the invasion of the water vapor even if the metal layer is close to the edge of the substrate SB or the circuit board CB. However, in a conventional electronic product, a position of a conventional connecting hole of the bonding pad on the substrate SB is close to the third edge EG3 of the circuit board CB or close to the edge SBe of the substrate SB, there is no insulating layer in the conventional connecting hole (which means a portion of the metal layer is not covered by the insulating layer and is exposed by the conventional connecting hole), and the conductive adhesive CP and the transparent conductive layer TCL of the bonding pad do not have the good function of resisting the water vapor (the conductive adhesive CP has voids, and the transparent conductive layer TCL has a columnar crystal structure which cannot resist the water vapor). Thus, the water vapor can easily react with the metal (i.e. rust reaction) through the conventional connecting hole of the bonding pad configured to expose the metal layer, such that the resistance of metal is increased to influence the transmission of signals and the operation of the electronic product. For the worse, the bonding pad may be burned and breakdown of the electronic product may be caused. In this embodiment, when the water vapor invades from the side close to the third edge EG3 of the circuit board CB (a side close to the first edge EG1 of the transparent conductive pattern 130) or from the side close to the edge SBe of the substrate SB (a side close to the second edge EG2 of the transparent conductive pattern 130), because the connecting holes of the bonding pad structure 10 of this embodiment are separated from the edge of the bonding pad structure by a specific distance (that is, the spacing S1 between the first edge EG1 and the first connecting hole H1, the spacing S2 between the first edge EG1 and the second connecting hole H2, the spacing S3 between the second edge EG2 and the first connecting hole H1 and the spacing S4 between the second edge EG2 and the second connecting hole H2 are greater than or equal to 100 μm), a path length that the water vapor invades the connecting hole is increased. Therefore, compared with the conventional bonding pad, since the distances between the connecting holes and the edge of the bonding pad structure of this embodiment is greater, the time that the water vapor reaches the metal pattern through the connecting holes is significantly enhanced, so as to retard the phenomenon of eroding the metal pattern, protect the bonding pad structure 10 and enhance the life time and reliability of the electronic product EP. Note that, although the effect of resisting the water vapor is enhanced as the spacing S1, S2, S3 or S4 is increased, if the spacing S1, S2, S3 or S4 is too great, the number of the connecting holes may be reduced seriously, so as to influence the resistance of the bonding pad structure 10. Therefore, the spacings S1, S2, S3 and S4 between the edge and the connecting holes should not be too great.

The electronic product of the present invention is not limited to the above embodiments. Further embodiments or modifications of the present invention are described below. For ease of comparison, the same components will be labeled with the same symbol in the following description. The following description only details the differences between the embodiments, and same parts will not be redundantly described.

Figure 7:
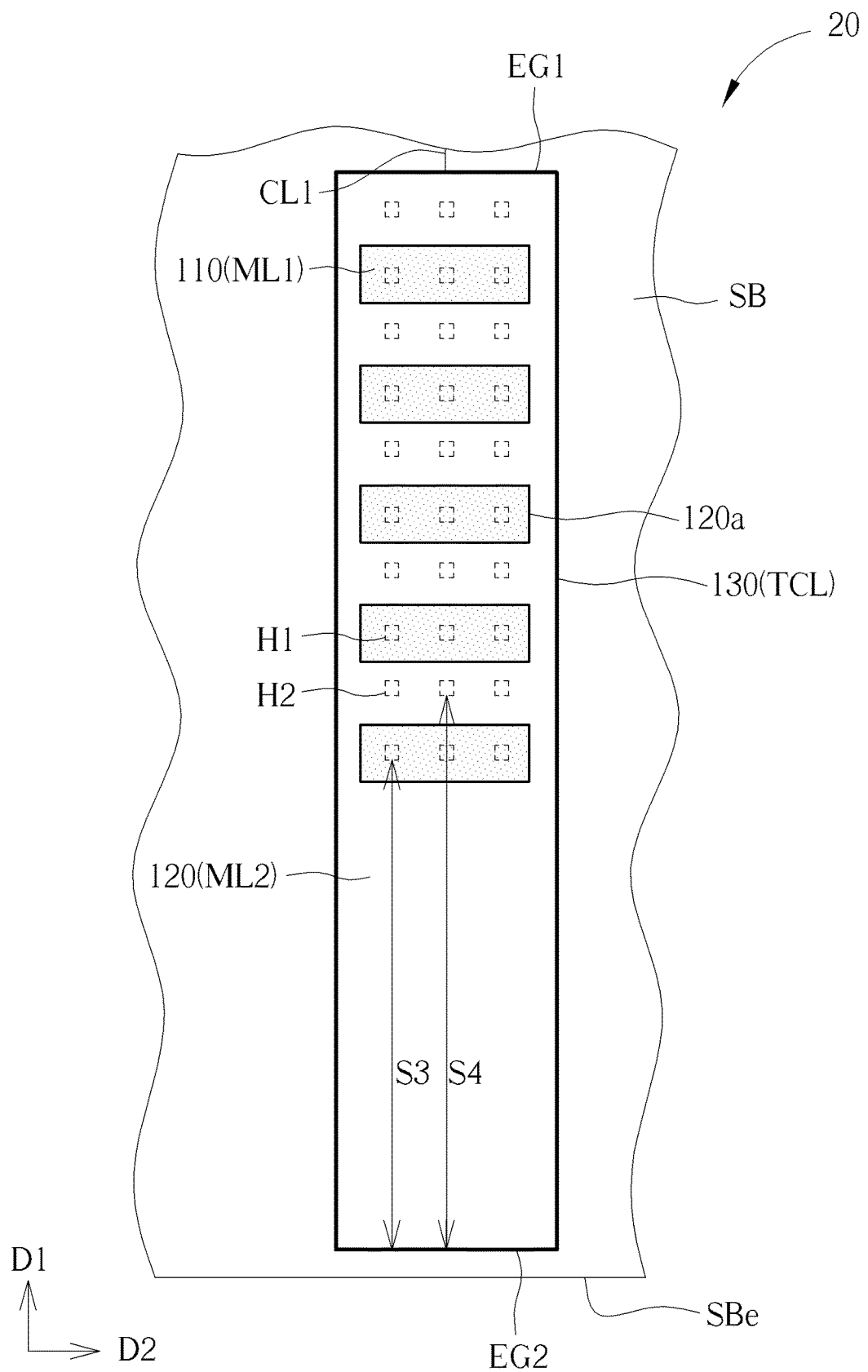
FIG. 7 is a top-view schematic diagram illustrating a bonding pad structure of an electronic product of a second embodiment of the present invention.

Referring to FIG. 7, FIG. 7 is a top-view schematic diagram illustrating a bonding pad structure of an electronic product of a second embodiment of the present invention. As shown in FIG. 7, compared with the first embodiment, the spacing S3 between the second edge EG2 of the transparent conductive pattern 130 and the first connecting hole H1 of the bonding pad structure 20 is greater than or equal to 100 μm, and the spacing S4 between the second edge EG2 of the transparent conductive pattern 130 and the second connecting hole H2 is greater than or equal to 100 μm in the electronic product EP of this embodiment, but the spacing between the first edge EG1 and one of the connecting holes is not limited. That is to say, the first connecting hole H1 and the second connecting hole H2 are 100 μm or greater than 100 μm from the edge of the transparent conductive layer TCL closest to the edge SBe of the substrate SB. In this embodiment, the connecting holes of the bonding pad structure 20 are separated from the second edge EG2 by a specific distance (that is, the spacing S3 between the second edge EG2 and the first connecting hole H1 and the spacing S4 between the second edge EG2 and the second connecting hole H2 are greater than or equal to 100 μm). Therefore, compared with the conventional bonding pad, since the distances between the connecting holes and the edge of the bonding pad structure 20 of this embodiment are greater, the path length that the water vapor invades the connecting holes from the side close to the edge SBe of the substrate SB is increased. Accordingly, the time that the water vapor reaches the metal pattern through the connecting holes is significantly enhanced, so as to retard the phenomenon of eroding the metal pattern, protect the bonding pad structure 20 and enhance the life time and reliability of the electronic product EP.

Figure 8:
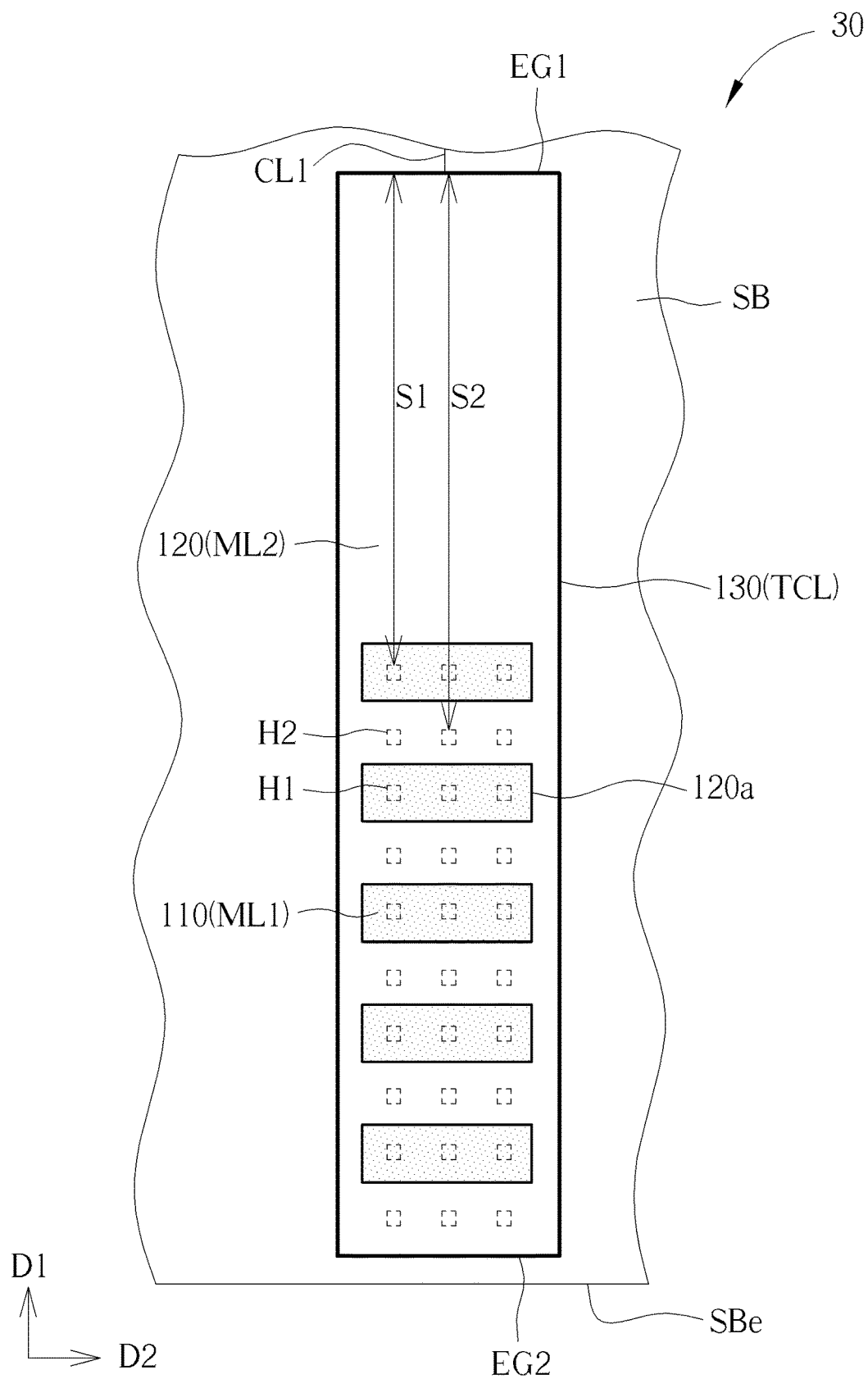
FIG. 8 is a top-view schematic diagram illustrating a bonding pad structure of an electronic product of a third embodiment of the present invention.

Referring to FIG. 8, FIG. 8 is a top-view schematic diagram illustrating a bonding pad structure of an electronic product of a third embodiment of the present invention. As shown in FIG. 8, compared with the first embodiment, the spacing S1 between the first edge EG1 of the transparent conductive pattern 130 and the first connecting hole H1 of the bonding pad structure 30 is greater than or equal to 100 μm, and the spacing S2 of the first edge EG1 of the transparent conductive pattern 130 and the second connecting hole H2 is greater than or equal to 100 μm in the electronic product EP of this embodiment, but the spacing between the second edge EG2 and one of the connecting holes is not limited. In this embodiment, the connecting holes of the bonding pad structure 30 are separated from the first edge EG1 by a specific distance (that is, the spacing S1 between the first edge EG1 and the first connecting hole H1 and the spacing S2 between the first edge EG1 and the second connecting hole H2 are greater than or equal to 100 μm). Therefore, compared with the conventional bonding pad, since the distances between the connecting holes and the edge of the bonding pad structure 30 of this embodiment is greater, the path length that the water vapor invades the connecting holes from the side close to the third edge EG3 of the circuit board CB is increased. Accordingly, the time that the water vapor reaches the metal pattern through the connecting holes is significantly enhanced, so as to retard the phenomenon of eroding the metal pattern, protect the bonding pad structure 30 and enhance the life time and reliability of the electronic product EP.

In summary, in the electronic product of the present invention, the connecting hole of the bonding pad structure is separated from the edge of the bonding pad structure by a specific distance; that is to say, the spacing between the connecting hole and the edge of the bonding pad structure is greater than or equal to 100 μm. Therefore, the path length that the water vapor invades the connecting hole is increased. As the result, the time that the water vapor reaches the metal pattern through the connecting hole is significantly enhanced, so as to retard the phenomenon of eroding the metal pattern, protect the bonding pad structure and enhance the life time and reliability of the electronic product.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electronic product, comprising:
   a substrate;
   a bonding pad structure disposed on the substrate, the bonding pad structure comprising:
   a first metal layer disposed on the substrate;
   a first insulating layer disposed on the first metal layer;
   at least one first connecting hole situated in the first insulating layer, and the first connecting hole exposing a portion of the first metal layer; and
   a transparent conductive layer disposed on the first insulating layer, the transparent conductive layer having a first edge and a second edge opposite to the first edge, wherein the transparent conductive layer is electrically connected to the first metal layer through the first connecting hole; and
   a circuit board disposed on the bonding pad structure,
   wherein a spacing between the first edge and the first connecting hole is greater than or equal to 100 μm, the circuit board is bonded with and electrically connected to the bonding pad structure, the circuit board has a third edge overlapping the substrate, a first distance is spaced between the first edge of the transparent conductive layer and the third edge, a second distance is spaced between the second edge of the transparent conductive layer and the third edge, and the first distance is less than the second distance.

2. The electronic product of claim 1, wherein another spacing between the second edge and the first connecting hole is greater than or equal to 100 μm.

3. The electronic product of claim 1, wherein the transparent conductive layer is disposed adjacent to an edge of the substrate, and the first edge is an edge of the transparent conductive layer closest to the edge of the substrate.

4. The electronic product of claim 1, wherein the bonding pad structure further comprises:
   a second metal layer disposed on the first insulating layer;
   a second insulating layer disposed between the second metal layer and the transparent conductive layer; and
   at least one second connecting hole situated in the second insulating layer, and the second connecting hole exposing a portion of the second metal layer, wherein the transparent conductive layer is electrically connected to the second metal layer through the second connecting hole;
   wherein the first connecting hole is situated in the first insulating layer and the second insulating layer, and another spacing between the first edge and the second connecting hole is greater than or equal to 100 μm.

5. The electronic product of claim 4, wherein the at least one first connecting hole is a plurality of first connecting holes, the at least one second connecting hole is a plurality of second connecting holes, and the first connecting holes and the second connecting holes are arranged alternately in a direction.

6. The electronic product of claim 1, further comprising another bonding pad structure, wherein the bonding pad structures are arranged along an edge of the substrate.

7. The electronic product of claim 1, further comprising a circuit disposed on the substrate, wherein the circuit is electrically connected to the bonding pad structure.

8. The electronic product of claim 7, further comprising a plurality of traces electrically connected between the circuit and the bonding pad structure, wherein the traces is adjacent to the first edge of the transparent conductive layer.

9. The electronic product of claim 1, wherein the electronic product is a display panel, a touch panel or a touch display panel.

10. An electronic product, comprising:
    a substrate; and
    a bonding pad structure disposed on the substrate, the bonding pad structure comprising:
    a first metal layer disposed on the substrate;
    a first insulating layer disposed on the first metal layer;

a transparent conductive layer disposed on the first insulating layer, the transparent conductive layer having a first edge and a second edge opposite to the first edge;

a second metal layer disposed on the first insulating layer;

a second insulating layer disposed between the second metal layer and the transparent conductive layer;

at least one first connecting hole situated in the first insulating layer and the second insulating layer, and the first connecting hole exposing a portion of the first metal layer, wherein the transparent conductive layer is electrically connected to the first metal layer through the first connecting hole; and at least one second connecting hole situated in the second insulating layer, and the second connecting hole exposing a portion of the second metal layer, wherein the transparent conductive layer is electrically connected to the second metal layer through the second connecting hole, wherein a spacing between the first edge and the first connecting hole is greater than or equal to 100 µm, and a spacing between the first edge and the second connecting hole is greater than or equal to 100 µm.

11. The electronic product of claim 10, wherein a spacing between the second edge and the first connecting hole is greater than or equal to 100 µm.

12. The electronic product of claim 10, wherein the transparent conductive layer is disposed adjacent to an edge of the substrate, and the first edge is an edge of the transparent conductive layer closest to the edge of the substrate.

13. The electronic product of claim 10, wherein the at least one first connecting hole is a plurality of first connecting holes, the at least one second connecting hole is a plurality of second connecting holes, and the first connecting holes and the second connecting holes are arranged alternately in a direction.

14. The electronic product of claim 10, further comprising another bonding pad structure, wherein the bonding pad structures are arranged along an edge of the substrate.

15. The electronic product of claim 10, further comprising a circuit disposed on the substrate, wherein the circuit is electrically connected to the bonding pad structure.

16. The electronic product of claim 15, further comprising a plurality of traces electrically connected between the circuit and the bonding pad structure, wherein the traces is adjacent to the first edge of the transparent conductive layer.

17. The electronic product of claim 10, wherein the electronic product is a display panel, a touch panel or a touch display panel.

* * * * *